(12) United States Patent
Pavier et al.

(10) Patent No.: US 10,103,076 B2
(45) Date of Patent: Oct. 16, 2018

(54) SEMICONDUCTOR PACKAGE INCLUDING A SEMICONDUCTOR DIE HAVING REDISTRIBUTED PADS

(71) Applicant: Infineon Technologies Americas Corp., El Segundo, CA (US)

(72) Inventors: Mark Pavier, Fellbridge (GB); Andrew N. Sawle, East Grinstead (GB); Martin Standing, Velden (AT)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/425,582

(22) Filed: Feb. 6, 2017

(65) Prior Publication Data

US 2017/0148692 A1    May 25, 2017

Related U.S. Application Data

(62) Division of application No. 11/595,206, filed on Nov. 10, 2006, now Pat. No. 9,633,951.

(Continued)

(51) Int. Cl.
*H01L 21/00*     (2006.01)
*H01L 23/043*    (2006.01)
(Continued)

(52) U.S. Cl.
CPC ............ *H01L 23/043* (2013.01); *H01L 21/56* (2013.01); *H01L 23/3171* (2013.01);
(Continued)

(58) Field of Classification Search
CPC ....... H01L 2224/97; H01L 2924/15165; H01L 2224/24227; H01L 2224/73153;
(Continued)

(56) References Cited

U.S. PATENT DOCUMENTS 6,507,110 B1   1/2003 Chen et al.
6,639,324 B1   10/2003 Chien
(Continued)

FOREIGN PATENT DOCUMENTS

TW     I223579 B     11/2004
TW     200427029 A   12/2004

OTHER PUBLICATIONS

International Preliminary Report on Patentability from International Application No. PCT/US2006/043520, dated Mar. 17, 2009, 9 pp.

(Continued)

*Primary Examiner* — Meiya Li
(74) *Attorney, Agent, or Firm* — Shumaker & Sieffert, P.A.

(57) ABSTRACT

A method includes coupling a first major surface of a semiconductor die to a metallic body, depositing an insulation body over said semiconductor die, and removing a portion of said insulation body to expose a plurality of electrodes of said semiconductor die on a second major surface of said semiconductor die opposite said first surface. The method further includes forming a plurality of conductive pads over the plurality of electrodes, each conductive pad of said plurality of conductive pads providing an external connection for a respective one of said plurality of electrodes, wherein each conductive pad of said plurality of conductive pads has an area larger than an area of said respective one of said plurality of electrodes to which the respective conforming conductive pad of said plurality of conductive pads is coupled and extending over said insulation body.

8 Claims, 9 Drawing Sheets

Related U.S. Application Data

(60) Provisional application No. 60/736,003, filed on Nov. 10, 2005.

(51) Int. Cl.

| | |
|---|---|
| *H01L 23/00* | (2006.01) |
| *H01L 23/31* | (2006.01) |
| *H01L 23/492* | (2006.01) |
| *H01L 25/07* | (2006.01) |
| *H01L 23/498* | (2006.01) |
| *H01L 21/56* | (2006.01) |
| *H01L 23/495* | (2006.01) |
| *H01L 23/367* | (2006.01) |
| *H01L 23/373* | (2006.01) |

(52) U.S. Cl.
CPC ...... *H01L 23/3675* (2013.01); *H01L 23/3736* (2013.01); *H01L 23/492* (2013.01); *H01L 23/49562* (2013.01); *H01L 23/49582* (2013.01); *H01L 23/49838* (2013.01); *H01L 24/03* (2013.01); *H01L 24/05* (2013.01); *H01L 24/32* (2013.01); *H01L 24/37* (2013.01); *H01L 24/83* (2013.01); *H01L 24/97* (2013.01); *H01L 25/07* (2013.01); *H01L 2224/0346* (2013.01); *H01L 2224/0508* (2013.01); *H01L 2224/05139* (2013.01); *H01L 2224/05144* (2013.01); *H01L 2224/05147* (2013.01); *H01L 2224/05155* (2013.01); *H01L 2224/2919* (2013.01); *H01L 2224/32245* (2013.01); *H01L 2224/33181* (2013.01); *H01L 2224/37147* (2013.01); *H01L 2224/83815* (2013.01); *H01L 2924/01047* (2013.01); *H01L 2924/13055* (2013.01); *H01L 2924/13091* (2013.01); *H01L 2924/15738* (2013.01); *H01L 2924/15747* (2013.01); *H01L 2924/403* (2013.01); *H01L 2924/40252* (2013.01); *H01L 2924/40407* (2013.01)

(58) Field of Classification Search
CPC . H01L 2924/15153; H01L 2924/15311; H01L 2224/82; H01L 2224/24226; H01L 2224/32245; H01L 2224/32257; H01L 2224/73267

See application file for complete search history.

(56) References Cited

U.S. PATENT DOCUMENTS

| | | |
|---|---|---|
| 6,709,898 B1 * | 3/2004 | Ma .................. H01L 23/3128 257/675 |
| 2002/0140059 A1 | 10/2002 | Yamazaki et al. |
| 2003/0160258 A1 | 8/2003 | Oohata |
| 2004/0238945 A1 | 12/2004 | Huang et al. |
| 2005/0167775 A1 | 8/2005 | Nagy et al. |
| 2007/0040186 A1 | 2/2007 | Fillion et al. |
| 2007/0090496 A1 | 4/2007 | Otremba |
| 2007/0108585 A1 | 5/2007 | Pavier et al. |

OTHER PUBLICATIONS

International Search Report issued in corresponding PCT Application No. PCT/US06/43520 dated May 20, 2008.
Prosecution History from U.S. Appl. No. 11/595,206, dated Feb. 19, 2009 through Dec. 20, 2016, 205 pp.

* cited by examiner

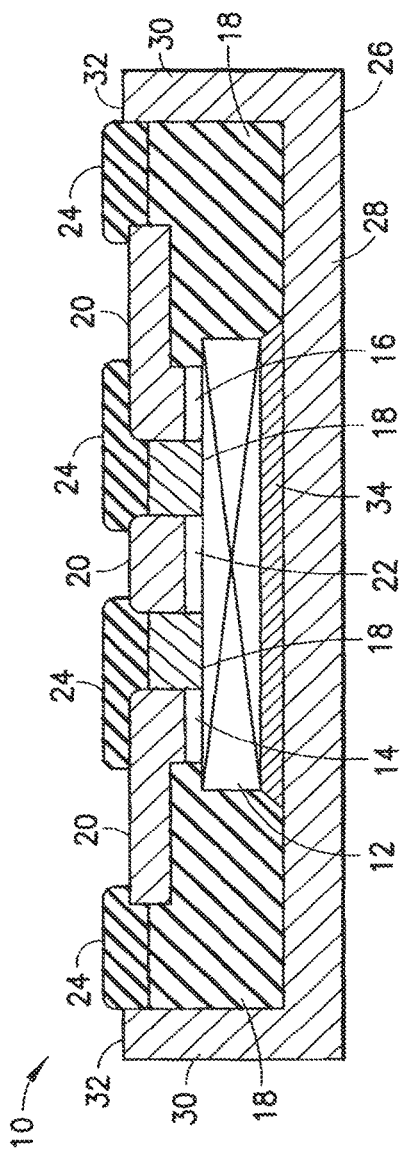
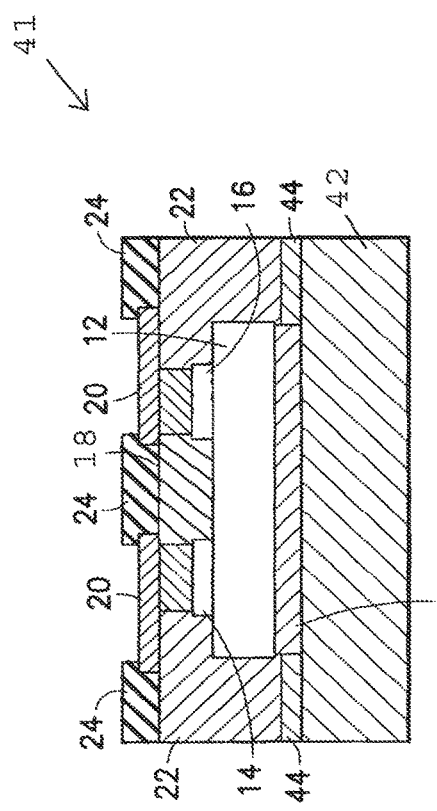
FIG. 1
FIG. 3

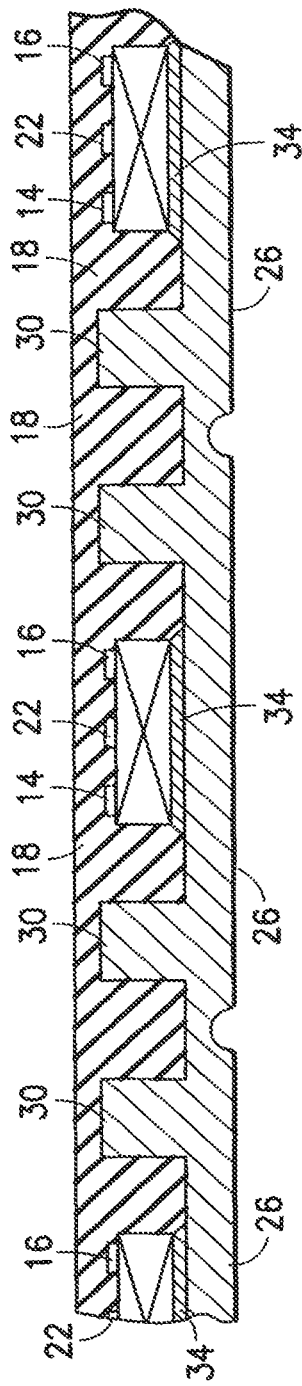
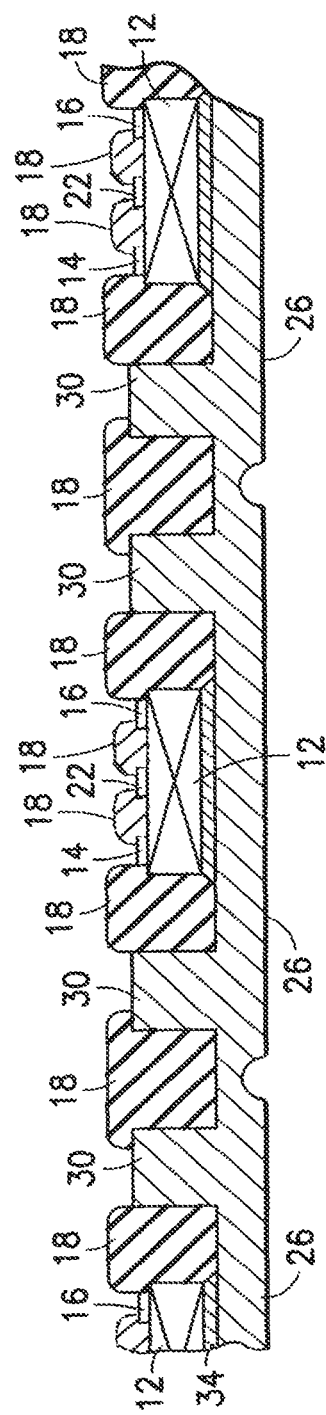
FIG.2C
FIG.2D

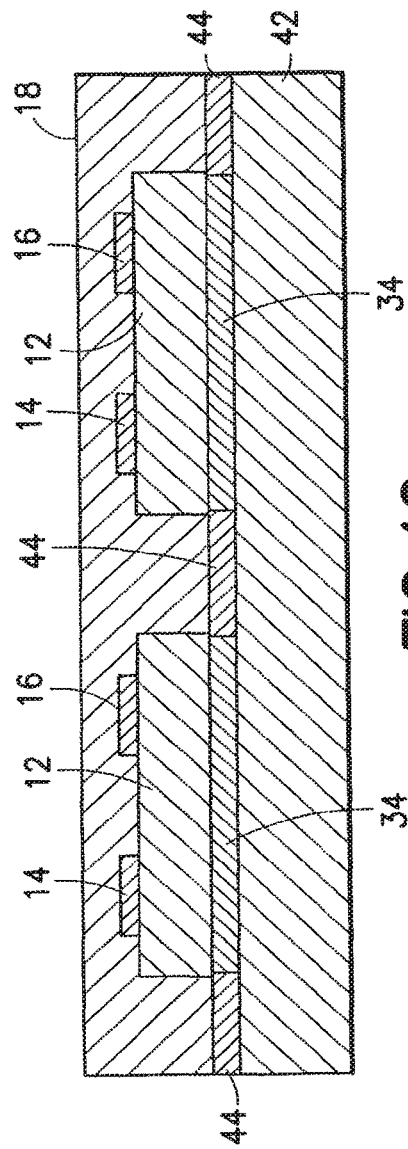
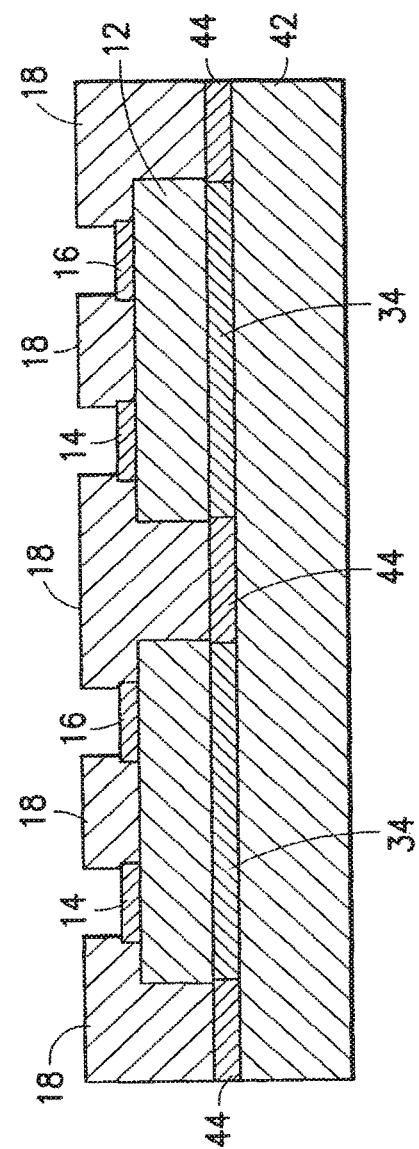
FIG. 4C
FIG. 4D

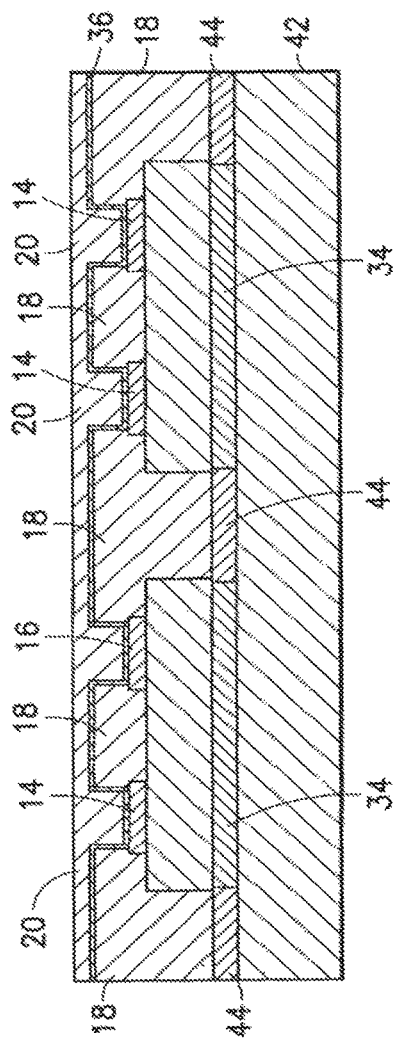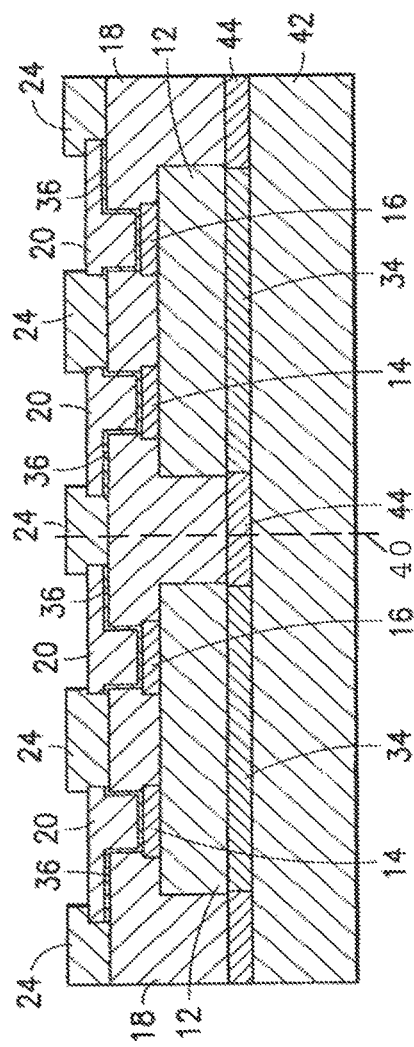

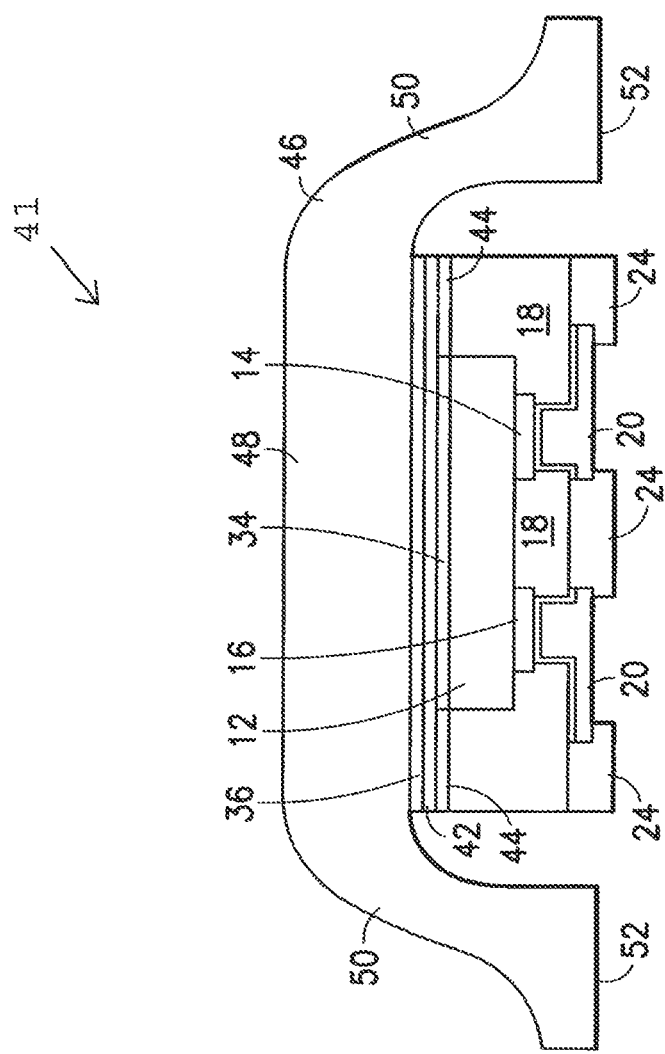

SEMICONDUCTOR PACKAGE INCLUDING A SEMICONDUCTOR DIE HAVING REDISTRIBUTED PADS

RELATED APPLICATION

This application is a divisional of U.S. patent application Ser. No. 11/595,206 filed Nov. 10, 2006, which claims benefit of the United States Provisional Application Ser. No. 60/736,003, filed on Nov. 10, 2005, entitled Power Semiconductor Die with Redistributed Contact Pads, the entire content of each one of which is incorporated by reference.

BACKGROUND OF THE INVENTION

The present invention relates to semiconductor packages and methods of fabricating semiconductor packages.

As demand for improved performance and reduction in the cost of semiconductor devices such as power semiconductor devices increases, the size of semiconductor devices decreases while the performance thereof increases. Specifically, it is anticipated that to reduce the cost of manufacturing more die must be fabricated out of a single wafer, while each die must provide better characteristics, such as more current carrying capability per unit area. Consequently, it is expected that as the die size decreases the electrodes thereof that make external connection via, for example, a solder body will also decrease in size while the current passed therethrough will increase.

It is believed that the reduction in the size of the electrodes combined with an increase in the current load passing through the electrode and its solder connection, particularly in the presence of high switching frequencies, may result in a higher than desirable failure rate in the solder connection due, for example, to electromigration or the like phenomenon.

Furthermore, it may become difficult for the end users of semiconductor die to adapt to connecting semiconductor die to conductive pads or the like of circuit boards if the electrodes are made small.

SUMMARY OF THE INVENTION

A semiconductor package according to the present invention includes a semiconductor die, the die including an electrode having an area, a conductive pad directly connected to the electrode, the pad having an area that is larger than the area of the electrode of the die, whereby the electrode of the die is redistributed to a larger connection surface for external connection.

A semiconductor package according to the present invention includes a semiconductor die including at least one electrode disposed on one major surface thereof, the electrode having a first area, an insulation body disposed around the semiconductor die, and a conforming conductive pad being coupled to the at least one electrode and extending over and conforming to a portion of the insulation body, the conforming pad having an area that is larger than the area of the electrode.

In a package according to one preferred embodiment, the conductive pad may include a solderable surface, and/or a passivation body, which may have solder resist characteristics, disposed over the semiconductor die, the passivation body including at least one opening over the conforming conductive pad.

According to one embodiment of the present invention, the web portion of a conductive clip is coupled to another major surface of the semiconductor die opposite the one major surface thereof. The clip may include at least one lead extending from an edge of the web portion, the lead including a connection surface generally coplanar with the conforming conductive pad.

In another embodiment of the present invention a conductive plate is coupled to another major surface of the semiconductor die opposite the one major surface.

A method for fabricating a semiconductor package includes coupling a first major surface of a semiconductor die to a metallic body, depositing an insulation body over the semiconductor die, removing a portion of the insulation body to expose at least one electrode of the semiconductor die on a second major surface of the semiconductor die opposite the first surface, the one electrode having an area, and forming a conductive pad having an area larger than the area of the one electrode and extending over the insulation body.

Other features and advantages of the present invention will become apparent from the following description of the invention which refers to the accompanying drawings.

BRIEF DESCRIPTION OF THE DRAWINGS

FIG. 1 illustrates a cross-section view of a package according to the first embodiment of the present invention.

FIGS. 2A-2H illustrate a method for fabricating a package according to the first embodiment.

FIG. 3 illustrates a package according to the second embodiment of the present invention.

FIGS. 4A-4F illustrate a method for fabricating a package according to the second embodiment.

FIG. 5 illustrates a enhanced package according to the second embodiment of the present invention.

DETAILED DESCRIPTION OF EMBODIMENTS OF THE INVENTION

Figure 2A:
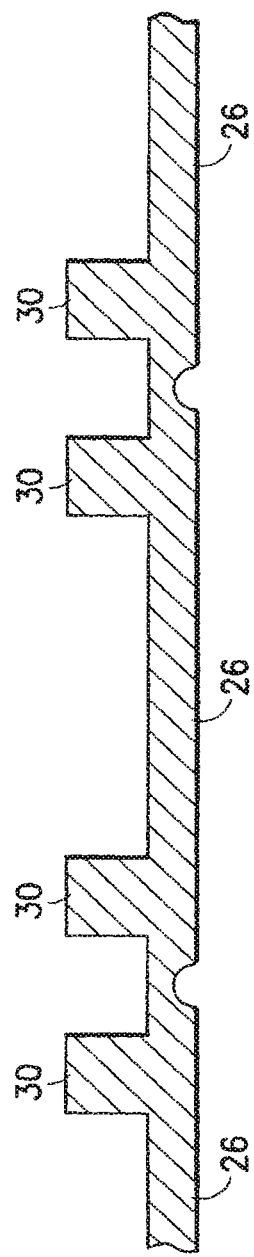
Figure 2B:
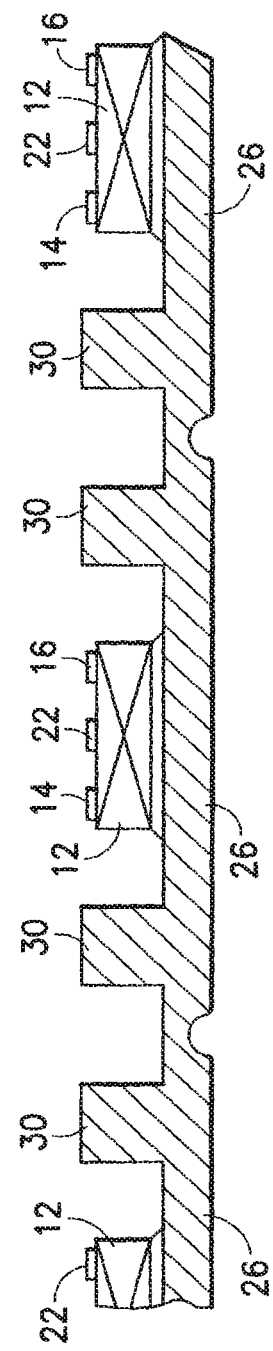

Referring to FIG. 1, a semiconductor package 10 according to the first embodiment of the present invention includes a semiconductor die 12, which may be a power semiconductor device, such as a power MOSFET or an IGBT, having preferably two electrodes, first electrode 14 and second electrode 16, on one surface thereof. Electrodes 14, 16 may be power electrode 14 (e.g. source electrode or emitter electrode) and control electrode 16 (e.g. gate electrode) respectively. An insulation body 18 is disposed around die 12 but includes openings leading to and exposing at least a portion of each electrode 14, 16. According to an aspect of the present invention a conforming conductive pad 20 (made, for example, from copper or the like metal) is coupled to each electrode 14, 16 and extends through a respective opening in and over a portion of insulation body 18. To obtain the desired distribution, each contouring conductive pad 20 has a larger free surface area available for external connection than the surface area of the electrode to which it is coupled. Note that each pad conforms to (i.e. follows the contours of) the portion of insulation body 18 over which it lies. Further note that each pad 20 is directly coupled to respective electrode 14, 16 without the solder or the like conductive adhesive.

Semiconductor die 12 may be a lateral condition device and thus may include third power electrode 22 (e.g. drain electrode or collector electrode) arranged generally coplanar with electrodes 14, 16. Note that a conforming conductive pad 20 is coupled to electrode 22 and redistributes electrode 22 in the same manner as the other electrodes 14, 16.

Conductive pads 20 are preferably rendered solderable with a solderable body such as a Ni/Ag or Ni/Au stack.

A package according to the present invention preferably includes a passivation body 24. Passivation body 24 preferably includes solder resist characteristics, and as shown is disposed between pads 20 to prevent shorting due to solder encroachment during solder reflow when package 10 is being mounted onto an end user's circuit board or assembly.

Package 20 may further include a conductive clip 26 (formed, for example, from copper or a copper alloy). Clip 26 includes a web portion 28, and lead portion 30 each having a connection surface 32 which is generally coplanar with pads 20. Web portion 28 of clip 26 may be thermally coupled to a surface of die 12 opposite pads 20 with a thermally conductive adhesive, such as, solder or a thermally conductive adhesive 34. Note that a die in a package according to the invention may be a vertical conduction device, in which case an active electrode (e.g. power electrode) may be disposed opposite to pads 20. In such a case, the active electrode so arranged may be electrically and mechanically coupled to clip 26 with solder, and clip 26 may be used as a lead frame as well as a thermal dissipater (i.e. heatsink, or heat spreader).

Figure 2E:
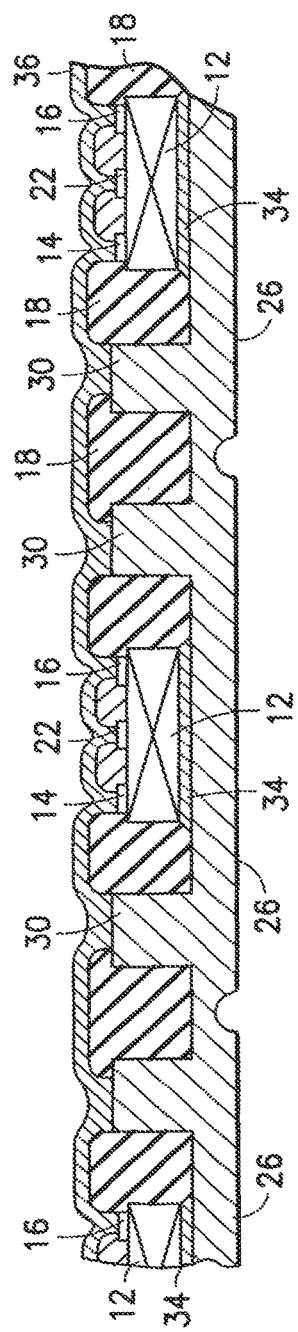
Figure 2F:
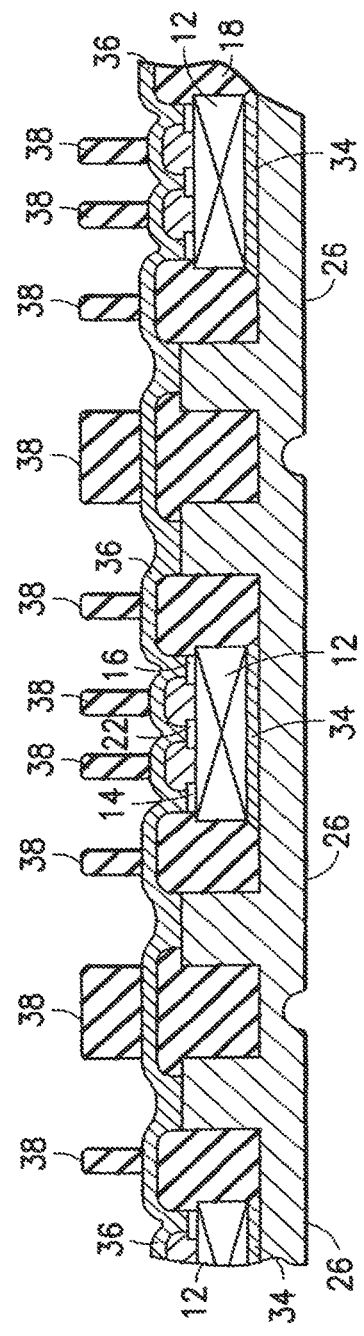
Figure 2G:
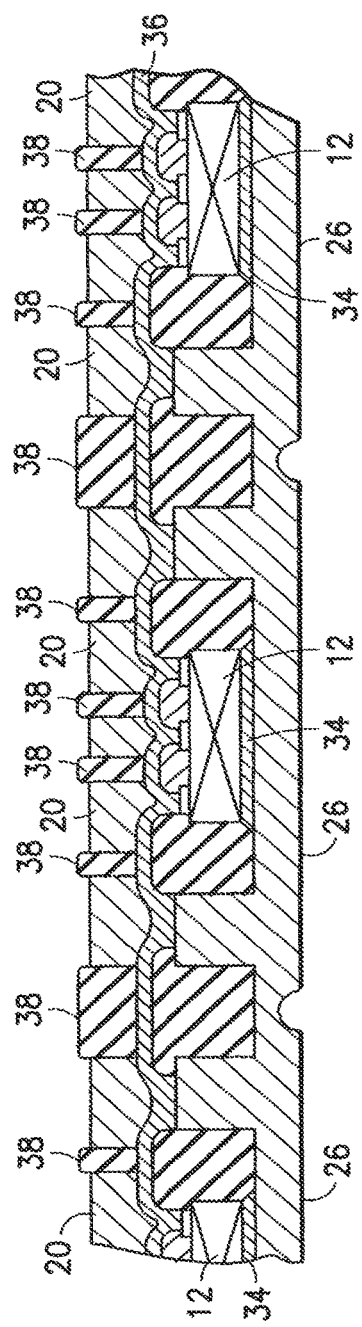
Figure 2H:
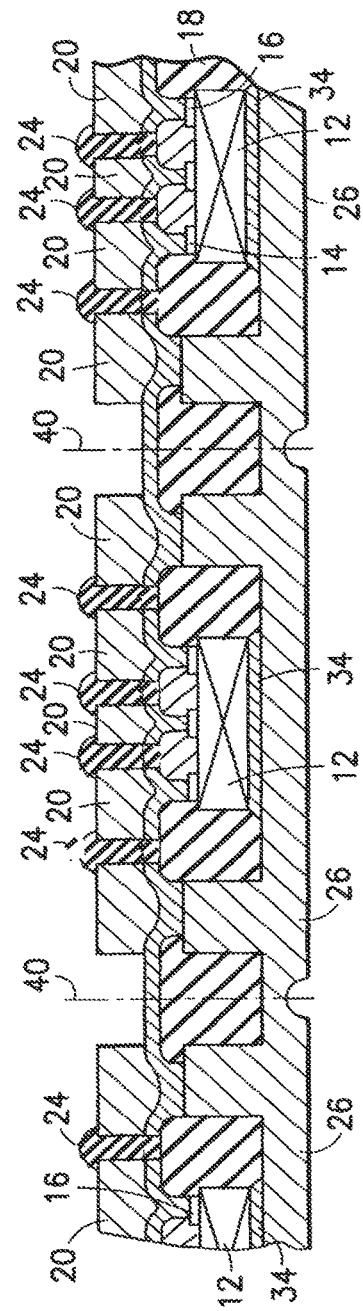

Referring to FIGS. 2A-2H, a package 10 according to the first embodiment of the present invention is fabricated by first providing a plurality of clips 26 interconnected to form a matrix (FIG. 2A) so that a number of packages can be fabricated simultaneously. Thereafter, solder 34 is deposited (e.g. in paste form) in the interior of each clip 26, die 12 is disposed over solder 34, and solder 34 is then reflown. Next, insulation 18, which is preferably photoimageable, is deposited over die 12 preferably encapsulating the same as shown in FIG. 2C. Portions of insulation 18 are then removed, through photolithography, to provide openings to expose electrodes 14, 16, 22. Thereafter, a copper seed layer 36 is applied by sputtering or the like on the arrangement shown by FIG. 2D as illustrated by FIG. 2E. Thereafter, a mask 38 is formed over seed layer 36. Note that mask 38 will define portions of seed layer 36 to be removed (as explained below).

It should be noted that insulation 18 need not be photoimageable but can be patterned using other techniques, for example, laser ablation. For example, when insulation 18 is thicker than a few tens of microns an alternate material containing fillers such as silica may be required. Photoimaging of such materials is not always possible as the exposure beam is not able to pass through the fillers or is blocked by the increased thickness of the passivation. Where this is the case a more suitable process for selectively removing passivation over contacts 14, 16 may be laser ablation. A suitable laser such as a neodymium-doped yttrium aluminum garnet (Nd:YAG), carbon dioxide (CO2) or eximer may be used to pattern the contact openings in insulation 18.

There are several other options available to create seed layer 36. For example, an electroless copper plating process can be used to deposit anywhere between 1 and 10 μm of copper over the surface of the assembly. The electroless plated seed layer can then be patterned through appropriate photolithography, and then electrolytic plating can be used to create thick conductive tracks. Any remaining photoresist from the photolithography step can be then stripped and the unwanted seed layer can be etched away.

Alternatively, a seed layer can be deposited using drop-on-demand deposition. In this case, ink containing a suspension of nano particulate (e.g. Ag or Cu) may be drop-on-demand deposited to create a silver or copper seed layer on the assembly. The assembly containing the ink is then cured to 'sinter' the metal nanoparticles together and create a metallic film in the region of 0.2 to 3 μms thick. Where this process is used it is possible to place the seed layer in pre-defined regions on the assembly and remove the requirement for the subsequent application of photoresist materials/pattern plating. Additional metal may also be deposited onto the seed layer using electroless or electrolytic copper deposition. Drop-on-demand deposition is disclosed in U.S. patent application Ser. No. 11/367,725, assigned to the assignee of the present application, and incorporated herein by this reference.

Next, pads 20 are formed over portions of seed layer 36 not covered by mask 38 through, for example, electroplating or electroless plating. Thereafter, mask 38 and portions of seed layer 36 below mask 38 are removed through appropriate etching or the like whereby isolated pads 20 are left remaining. Passivation body 24 is then applied and packages 10 are cut out along scribe lines 40 from the clip matrix.

Referring next to FIG. 3, in which like numerals identify like features, a semiconductor package 41 according to the second embodiment of the present invention includes flat conductive plate 42 (formed, for example, from copper or a copper alloy) instead of a clip as shown. In all other respects package 41 according to the second embodiment is similar to package 10.

Figure 4A:
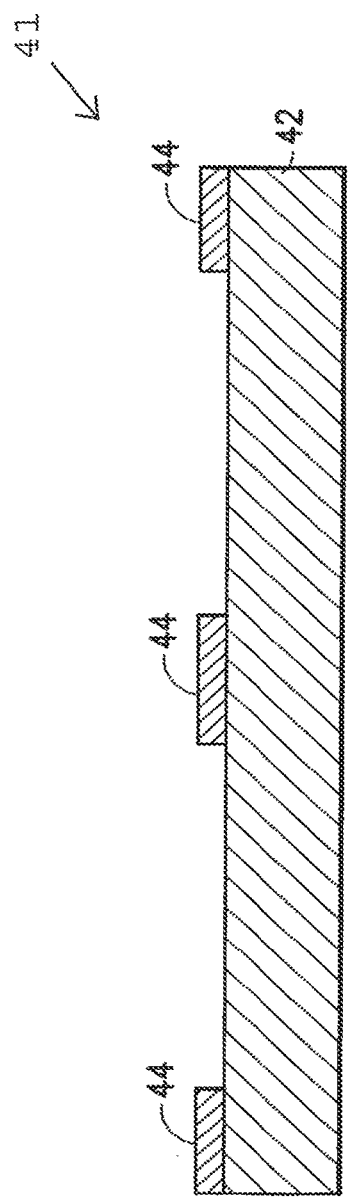
Figure 4B:
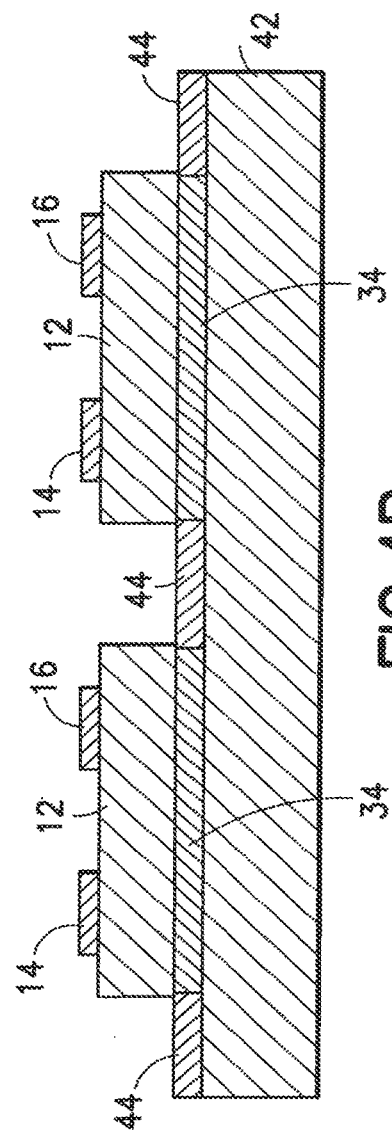

Referring to FIGS. 4A-4F, a package 41 according to the second embodiment is fabricated by first formed solder mask 44 over a surface of a large copper plate 42, solder mask 44 including openings therein to expose selected portions of plate 42 (see FIG. 4A). Solder paste 34 is then disposed inside each opening in mask 44, and after a respective die is disposed on each body of paste 34, paste 34 is reflown (see FIG. 4B). Thereafter, insulation 18 is deposited over die 12 to encapsulate the same (see FIG. 4C). Portions of insulation 18 are then removed to expose electrodes 14, 16 of die 12 (FIG. 4D), a copper seed layer 36 is formed as previously described, and then copper is plated on seed layer 36. Plated copper 20 is then patterned to form pads 20, passivation body 24 is then applied, and packages 41 are cut out along scribe line 40, for example, to obtain packages according to the second embodiment. Note that solder mask 44 may not be required if the conductive adhesive contains epoxy or a similar polymeric adhesive such as a conductive epoxy (e.g. Ablestik 84-I) or an insulating polymer (e.g. Ablestik 84-3J)

In an alternative embodiment copper plate 42 can be replaced with a patterned substrate that includes insulated die pads (each pad for receiving a semiconductor die in the same manner described above) and traces. Such an alternative embodiment may allow for fabrication of multi-chip packages for, for example, half-bridge circuits or full bridge circuits.

Referring to FIG. 5, a conductive clip 46 (formed from, for example, copper or a copper alloy) having a web portion 48 and leads 50 can be coupled at least thermally and mechanically, or electrically and mechanically (when die 12 includes an active electrode opposite electrodes 14, 16) to plate 42 with a layer of thermally conductive adhesive, such as solder 34 conductive epoxy, or the like. Note that each lead 50 may include a connection surface 52, which is generally coplanar with pads 20. When die 12 includes an active electrode opposite pads 20, clip 46 can serve as a lead frame used for external electrical connection as well as a thermal dissipater for package 41. Otherwise, clip 46 can serve to dissipate heat from package 41, only.

In cases where die 12 includes a major electrode disposed on the back thereof (opposite electrodes 14, 16 on the front), it is possible to create a hole or via through insulation 18 to redistribute the back electrode to pads on the front side of the package that are co-planar with pads 20. In such a case the via sidewalls may be coated with metal using the seed/plating processes described above in order to electrically couple the back electrode that is electrically connected to the plate to the redistributed pad on the front surface of the package coplanar with pads 20.

In addition to pads 20, tracks may also be formed for interconnection while pads 20 are being processed. The tracks may be formed from Ag/Cu with Ni/Au solderable finish, or electroless/electrolytic copper and a solderable finish.

The present invention should not be understood to be limited to silicon-based semiconductor devices. Other semiconductor devices such as III-nitride based semiconductor devices can be used without deviating from the scope and spirit of the present invention.

In addition, the present invention is not limited to one semiconductor die per package. Rather, multiple die may be thermally and mechanically coupled to the lead frame in the manner described above before overmolding and other steps are carried out to obtain a package that includes more than one die. Furthermore, a package according to the present invention may include passive components (e.g. capacitors, resistors, inductors) which may be accessible through vias or the like access features in the clip or the metallic plate.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method for fabricating a semiconductor package, the method comprising:

coupling a first major surface of a semiconductor die to a metallic body;

depositing an insulation body over said semiconductor die;

removing a portion of said insulation body to expose a plurality of electrodes of said semiconductor die on a second major surface of said semiconductor die opposite said first surface;

forming a plurality of conductive pads over said plurality of electrodes, each conductive pad of said plurality of conductive pads providing an external connection for a respective one of said plurality of electrodes, wherein each conductive pad of said plurality of conductive pads has an area larger than an area of said respective one of said plurality of electrodes, wherein each conductive pad of said plurality of conductive pads is extending over said insulation body; and forming a passivation body between each adjacent one of said plurality of conductive pads, wherein a side surface of said passivation body is partially covered by said metallic body.

2. The method of claim 1, wherein said insulation body is photoimageable.

3. The method of claim 1, wherein said plurality of conductive pads are formed by forming a seed layer of a conductive material on said plurality of electrodes and plating a conductive body on said seed layer.

4. The method of claim 1, wherein said plurality of conductive pads are comprised of copper.

5. The method of claim 1, wherein said metallic body is a metallic plate.

6. The method of claim 1, wherein said metallic body is a metallic clip.

7. The method of claim 6, wherein said metallic clip includes a connection surface that is generally coplanar with said plurality of conductive pads.

8. The method of claim 6, wherein said metallic clip is cup-shaped.

* * * * *